United States Patent
Sandhu et al.

(10) Patent No.: US 10,734,805 B2
(45) Date of Patent: Aug. 4, 2020

(54) POWER CLAMP WITH CORRELATED ELECTRON MATERIAL DEVICE

(71) Applicant: ARM Limited, Cambridge (GB)

(72) Inventors: Bal S. Sandhu, Tremont, CA (US);
Lucian Shifren, San Jose, CA (US);
Glen Arnold Rosendale, Palo Alto, CA (US)

(73) Assignee: ARM Limited, Cambridge (GB)

( * ) Notice: Subject to any disclaimer, the term of this patent is extended or adjusted under 35 U.S.C. 154(b) by 654 days.

(21) Appl. No.: 15/381,393

(22) Filed: Dec. 16, 2016

(65) Prior Publication Data
US 2018/0175615 A1   Jun. 21, 2018

(51) Int. Cl.
*H02H 9/04* (2006.01)
*H01L 23/64* (2006.01)
*H01L 27/02* (2006.01)
*H03K 5/08* (2006.01)

(52) U.S. Cl.
CPC .......... *H02H 9/041* (2013.01); *H01L 23/64* (2013.01); *H01L 27/0266* (2013.01); *H01L 27/0288* (2013.01); *H03K 5/08* (2013.01)

(58) Field of Classification Search
CPC .......... H02H 9/04–046; H01L 27/0259; H01L 27/0266; H01L 27/0285; H01L 23/60–64; H01L 23/647; H01L 27/0248–0296
See application file for complete search history.

(56) References Cited

U.S. PATENT DOCUMENTS

| | | | |
|---|---|---|---|
| 4,068,281 A * | 1/1978 | Harnden, Jr. | H01C 7/10 338/20 |
| 7,102,862 B1 * | 9/2006 | Lien | H01L 27/0285 361/56 |
| 8,369,054 B2 | 2/2013 | Cai et al. | |
| 9,514,814 B1 * | 12/2016 | Sandhu | G11C 11/56 |
| 9,793,708 B1 * | 10/2017 | Glaser | H02H 9/046 |
| 2007/0058307 A1 * | 3/2007 | Mergens | H01L 27/0262 361/56 |
| 2009/0230940 A1 * | 9/2009 | Lim | H01L 27/0676 323/304 |

(Continued)

FOREIGN PATENT DOCUMENTS

WO   WO-2007111478 A1 * 10/2007 ........... H01L 49/003

*Primary Examiner* — Thienvu V Tran
*Assistant Examiner* — Christopher J Clark
(74) *Attorney, Agent, or Firm* — Leveque IP Law, P.C.

(57) ABSTRACT

A circuit is provided for limiting an applied voltage applied between a power line and an electrical ground. The circuit includes a transistive element connected between the power line and the electrical ground to provide a channel, where current flow through the channel is controlled by a control voltage provided to a control terminal of the transistive element. A first Correlated Electron Material (CEM) device having an impedance state is coupled between the power line and a first node, and a sensing circuit coupled between the first node and the control terminal of the transistive element. The sensing circuit is configured to detect a voltage drop across the CEM device and to provide the control voltage. The channel of the transistive element is opened when the detected voltage drop across the CEM device exceeds a threshold. The CEM device may contain a transition metal oxide (TMO), for example.

18 Claims, 4 Drawing Sheets

(56) References Cited

U.S. PATENT DOCUMENTS

| | | | |
|---|---|---|---|
| 2009/0231083 A1* | 9/2009 | Hosoi | G11C 13/0007 338/20 |
| 2011/0254613 A1* | 10/2011 | Kim | H01L 25/16 327/513 |
| 2013/0201586 A1* | 8/2013 | Torres | H02H 9/046 361/56 |
| 2013/0314825 A1* | 11/2013 | Bajaj | H02H 9/046 361/56 |
| 2014/0340812 A1* | 11/2014 | Sumi | H01T 1/20 361/220 |
| 2016/0056625 A1* | 2/2016 | Tsaur | H02H 9/045 361/56 |
| 2016/0155503 A1* | 6/2016 | Yoon | G11C 13/0069 711/102 |
| 2017/0045905 A1 | 2/2017 | Sandhu et al. | |
| 2017/0047919 A1 | 2/2017 | Sandhu et al. | |
| 2017/0244032 A1* | 8/2017 | Reid | H01L 49/003 |
| 2018/0076388 A1* | 3/2018 | Reid | G11C 13/0007 |
| 2018/0151800 A1* | 5/2018 | Paz de Araujo | C23C 14/0036 |
| 2018/0159031 A1* | 6/2018 | Paz de Araujo | H01L 45/1253 |

\* cited by examiner

POWER CLAMP WITH CORRELATED ELECTRON MATERIAL DEVICE

TECHNICAL FIELD

The present disclosure relates to a power clamp circuit having one or more Correlated Electron Material (CEM) devices having an impedance state.

BACKGROUND

Power clamps are used to provide electrostatic discharge (ESD) protection for semiconductor circuits and the like. A power clamp circuit may use an active R-C circuit to sense an ESD pulse. The resistance and capacitance values of the R-C circuit are typically subject to large manufacturing tolerances. Consequently, the current carrying capacity of the clamp transistor must be increased to accommodate the smallest R-C values and prevent the closure of the clamp transistor before an ESD pulse has been fully discharged.

Correlated Electron Material (CEM) exhibits an abrupt conductive/insulative state transition arising from electron correlations in the material, rather than from solid state structural phase changes. The transition may be controlled by a voltage and current applied across the material.

DETAILED DESCRIPTION OF THE EMBODIMENTS

Figure 1:
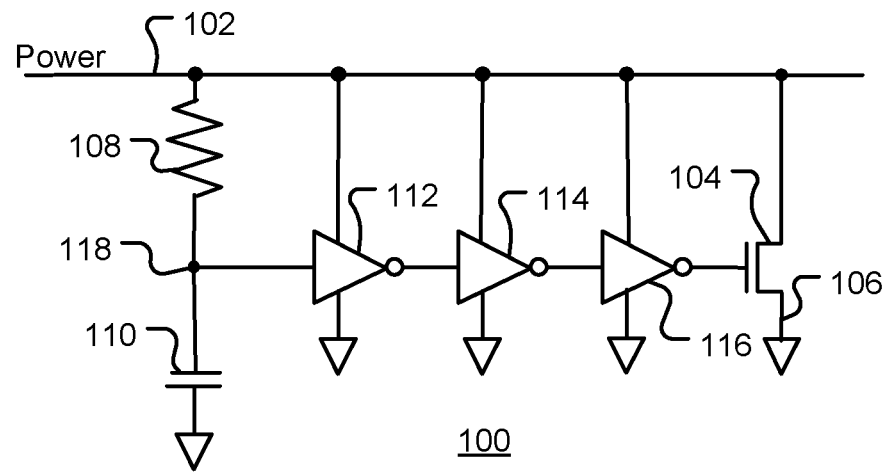
FIG. 1 is a diagram of a power clamp circuit with R-C sensing.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," "substantially," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

The various embodiments and examples of the present disclosure as presented herein are understood to be illustrative of the present disclosure and not restrictive thereof and are non-limiting with respect to the scope of the present disclosure.

Further particular and preferred aspects of the present disclosure are set out in the accompanying independent and dependent claims. Features of the dependent claims may be combined with features of the independent claims as appropriate, and in combinations other than those explicitly set out in the claims.

The present disclosure relates to a power clamp circuit that includes a correlated electron material (CEM) device having an impedance state.

A correlated electron material (CEM) is an material that may exhibit an abrupt state transition between conductor and insulator, arising from electron correlations rather than from solid state structural phase changes (such as the crystalline/amorphous phase change in phase change memory (PCM) devices or filamentary formation and conduction in resistive RAM devices). In one aspect, an abrupt conductor/insulator state transition in a CEM may be responsive to a quantum mechanical phenomenon, in contrast to melting/solidification or filament formation.

Embodiments of the disclosure relate to circuit for limiting an applied voltage applied between a power line and an electrical ground. The circuit includes a first transistive element, such as a clamp transistor, connected between the power line and the electrical ground to provide a channel. Current flow through the channel is controlled by a control voltage applied to a control terminal of the first transistive element. A first Correlated Electron Material (CEM) device is coupled between the power line and a first node and provides an impedance. An inversion logic circuit is coupled between the first node and the control terminal of the first transistor. A 'high' logic level of the inversion logic circuit is provided by the applied voltage.

In the description below, transistive elements are referred to as transistors and the control terminal is referred to as a gate terminal or gate. However, the disclosure is not limited to this embodiment and other voltage controlled channels may be used to provide a transistive element.

During a time period in which a voltage at the first node corresponds to a 'low' logic level, the control voltage is driven to a 'high' logic level that exceeds a threshold voltage of the clamping transistor. The applied voltage is then shunted to ground via the first transistor. The time period is dependent upon an impedance of the first CEM device.

The circuit may include a second CEM device and a second transistor that are coupled in series between the electrical ground and the first node. The second transistor is turned ON by the application of a RESET signal applied to a gate of the second transistor. When the second transistor is turned ON, the first and second CEM devices form a voltage divider operable to transition the first and second CEM devices to a high impedance state.

The inversion logic circuit may comprise a first inversion stage that receives an input from the first node and drives a second node as an output, a second inversion stage that receives an input from the second node and drives a third node as an output, and a third inversion stage that receives an input from the third node and drives the gate of the clamping transistor as an output. For example, the inversion logic circuit may comprise three inverters gates coupled in a series arrangement.

The first transistor may comprise an n-channel MOSFET, for example.

The time period is dependent upon an impedance of the first CEM device and the capacitance of the circuit.

FIG. 1 is a diagram of a conventional power clamp circuit 100 with R-C sensing. The conventional power clamp circuit 100 is designed to protect a circuit from electrostatic discharge (ESD) or other voltage spikes applied to power line 102. When an ESD pulse occurs, the gate of n-channel clamp transistor 104 is opened and the transistor is turned ON to allow the voltage to pass to ground 106. Resistor 108, such as an N-well resistor with resistance $R_{NW}$, together with capacitor 110, such as a metal-oxide semiconductor (MOS) capacitor with capacitance $C_M$, form an R-C sensing circuit with time constant $$T_{on} = R_{NW} * C_M. \tag{1}$$

Inverters 112, 114 and 116 invert the sensed voltage at node 118, located between capacitor 110 and resistor 108, and drive the gate of n-channel clamp transistor 104.

Under normal conditions, resistor 108 drives the input of inverter 112 high, causing a low to be driven onto the gate of n-channel clamp transistor 106, keeping it OFF. When the power-to-ground voltage suddenly spikes high, such as during an ESD event on the power pad/pin, capacitor 110 keeps voltage at node 118 low for a period of time determined by the R-C time constant. Thus, the input of inverter 112 is low (relative to the power line) during this period. The low input to inverter 112 drives the gate of n-channel clamp transistor 104 high, turning ON n-channel clamp transistor 104 and shunting current from power line 102 to ground 106, thereby dissipating the ESD pulse on power line 102. When capacitor 110 is fully charged, the voltage at node 118 matches that on power line 102. The input to inverter 112 is high relative to the power line and a low is again driven onto the gate of n-channel clamp transistor 104, turning it OFF for normal operation.

An ESD event may have a duration of tens of nanoseconds. In order to keep clamp transistor 106 on for tens of nanoseconds during an ESD event, the value of $R_{NW}$ may be in a range 100KΩ to 400KΩ, while the value of $C_M$ for MOS capacitor 110 may be in a range 2 pF to 5 pF, for example. This wide range in resistance and capacitance values occurs because both the resistance value $R_{NW}$ and the capacitance value $C_M$ vary from process to process. For example, the resistance $R_{NW}$, may vary by ±30% in the same process. The current carrying the capacity of the clamp transistor must be set to cope with a minimum expected R-C time constant.

Figure 2:
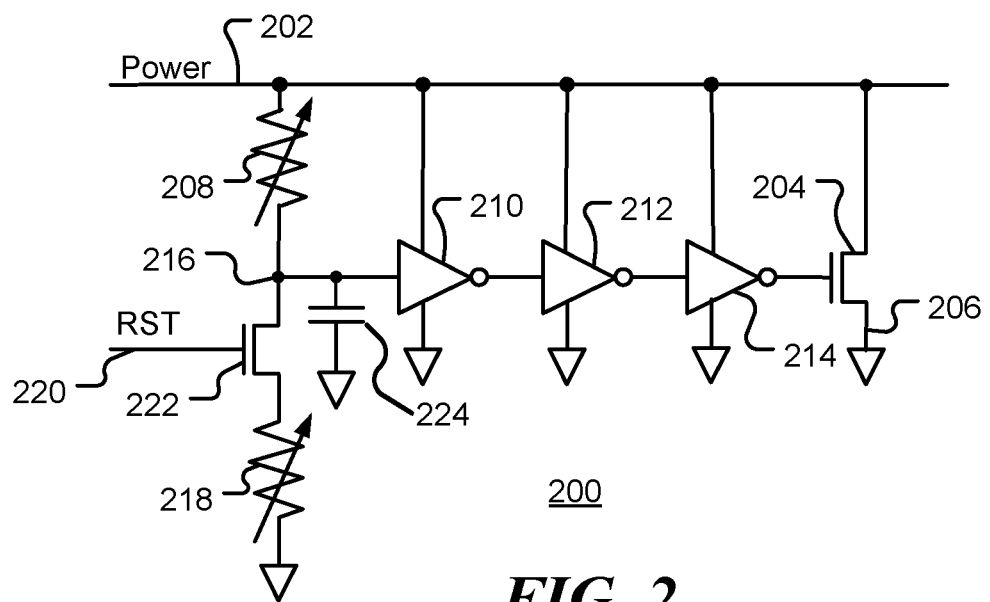
FIG. 2 is a diagram of a power clamp circuit using Correlated Electron Material, in accordance with embodiments of the disclosure.

FIG. 2 is a diagram of a power clamp circuit 200 using Correlated Electron Material (CEM) devices in accordance with embodiments of the disclosure. Power clamp circuit 200 is designed to protect a circuit from electrostatic discharge (ESD) or other voltage spikes applied to power line 202. When an ESD pulse occurs, the gate of n-channel transistor 204 is opened and the transistor is turned ON to pass the voltage to ground 206.

In contrast to a conventional power clamp circuit, circuit 200 uses a Correlated Electron Material (CEM) device 208. Correlated Electron Material (CEM), such as a transition metal oxide (TMO), may exhibit an abrupt state transition from low impedance to high impedance. The state transition arises from electron correlations in the material, rather than from any solid state structural phase change. The transition may be controlled by a voltage and current applied across the resistor.

In the high impedance state, CEM device 208 may have a resistance or the order of 10 MΩ, for example. In the low impedance state, CEM device 208 may have a resistance or the order of 100KΩ, for example. In some embodiments, although the capacitance of the CEM may be higher in the high impedance state than in the low impedance state, the stray capacitance of the remainder of the circuit may be considerably larger than the capacitance of the CEM device itself. Thus, when the CEM device is in a high impedance state, it forms an R-C circuit with the stray capacitance of the remainder of the circuit.

A benefit of CEM device 208 is that it can have a very high resistance. Consequently, in some embodiments, such as shown in FIG. 2, the need for an additional MOS capacitor is eliminated since a parasitic or stray capacitance 224 is provided by the junction capacitance on node 216 and the gate capacitance of inverter 210. Also, because of the much higher CEM resistance, the correspondingly lower capacitance can result in the same RC time constant.

A further benefit of CEM device 208 is that there is negligible process variation in the resistance value. Thus, a more accurate RC time constant is achieved for the power clamp.

The CEM device based power clamp circuit is therefore more accurate than a conventional power clamp circuit and occupies a smaller area.

Inverters 210, 212 and 214 invert the sensed voltage at node 216 and drive the gate of n-channel clamp transistor 204. The 'high' logic level for inverters 210, 212 and 214 is provided by the voltage applied on power line 202.

Under normal conditions, there is negligible current flow through resistor 208 and hence no voltage drop across the resistor. The input of inverter 210 is 'high', causing a low to be driven onto the gate of n-channel clamp transistor 204, keeping it OFF. When the power-to-ground voltage suddenly spikes high, such as during an ESD event on the power pad/pin, the stray capacitance of the circuit keeps voltage at node 216 'low' for a period of time determined by the R-C time constant of the circuit. Thus, the input of inverter 210 is 'low' (relative to the power line) during this period. The 'low' input to inverter 210 drives the gate of n-channel clamp transistor 204 'high', turning ON n-channel clamp transistor 204 and shunting current from power line 202 to ground 206, thereby dissipating the ESD pulse on power line 202. When the stray capacitance is fully charged, the voltage at node 216 matches that on power line 202. The input to inverter 210 is high relative to the power line and a 'low' is again driven onto the gate of n-channel clamp transistor 204, turning it OFF for normal operation.

A CEM device, such as a CEM device, is born in a low impedance state, that is, the doping of the transition-metal oxide (TMO) creates both electrons and holes. However, the doping is still p-type (defined by moving the Fermi level down in energy). The electrons are well screened in that there is no band-splitting, but are well above this new Fermi level. Therefore, the electrons do not contribute to transport. In the initial state, there is a large surplus of electrons in the CEM which do not contribute to current. When bias is applied, hole injection occurs causing a hole current. When sufficient bias is applied (greater than the band-splitting potential) a Mott transition occurs. The transition occurs when the number of injected holes equals the number of electrons trapped in the system. The CEM switches from a metal state to the insulator state via the Mott transition. At this point, the electrons are no longer screened and become localized, this correlation splits the bands causing the material to have a very high resistance. In this state, transport is still via holes. If enough bias is applied, electrons are injected. When enough electrons have been injected and enough potential is applied to overcome the set potential criteria, the increase in electrons screens the electrons and removes the localization—collapsing the band-splitting potential and forming a metal or low resistance material. The electrons injection into the system is controlled by the compliance of the system. The compliance therefore sets the number of electrons in the system that need to be "captured" by holes for the Mott transition to occur.

Correlated electron materials may be used in memory devices and switches, and other memory structures. The impedance state of a CEM device may be used to designate a stored data value, which may be read in a variety of ways. Data may be written to a CEM memory device using a variety of methods, examples of which are described in commonly-owned U.S. patent application Ser. No. 14/826,064 Programmable Voltage For Correlated Electron Switch and/or commonly-owned U.S. patent application Ser. No. 14/826,091 Programmable Current For Correlated Electron Switch which are incorporated herein by reference.

Initially, when manufactured, a CEM device is in a low impedance state. The resistor must be transitioned to a high impedance state for operation of power clamp circuit 200. In the embodiment shown in FIG. 2, a second CEM device 218 is used to form a voltage divider with resistor 208. During a power-up ramp, a global power-on reset (POR) signal 220 is generated which remains high for a short time after power is stable. During this time, the gate of transistor 222 is driven high and transistor 222 is turned ON. For example, if the normal voltage on power line 202 is 1.2V and resistors 208 and 218 have substantially equal values, 0.6V is applied across each resistor. Provided the current is sufficient, the applied voltage causes resistors 208 and 218 to transition from a low impedance state to a high impedance state. This property will remain in effect for any subsequent power up sequences.

For an ESD event, transistor 204 is turned ON and acts as a clamp to limit the voltage on power line 202 to below the drain-gate breakdown voltage of transistors protected by the power clamp.

Since the resistance value of CEM device 208 is high and has less manufacturing variation, the R-C time constant of the circuit may be increased relative to a conventional circuit. This enables a smaller transistor 204 to be used to dissipate the ESD pulse.

It will be apparent to those skilled in the art that other methods for transitioning the CEM device to a high impedance state may be used.

It will also be apparent that one or more resistors in other power clamp circuits may be replaced by one or more CEM devices so as to reduce manufacturing tolerances and provide high resistance values.

Figure 3:
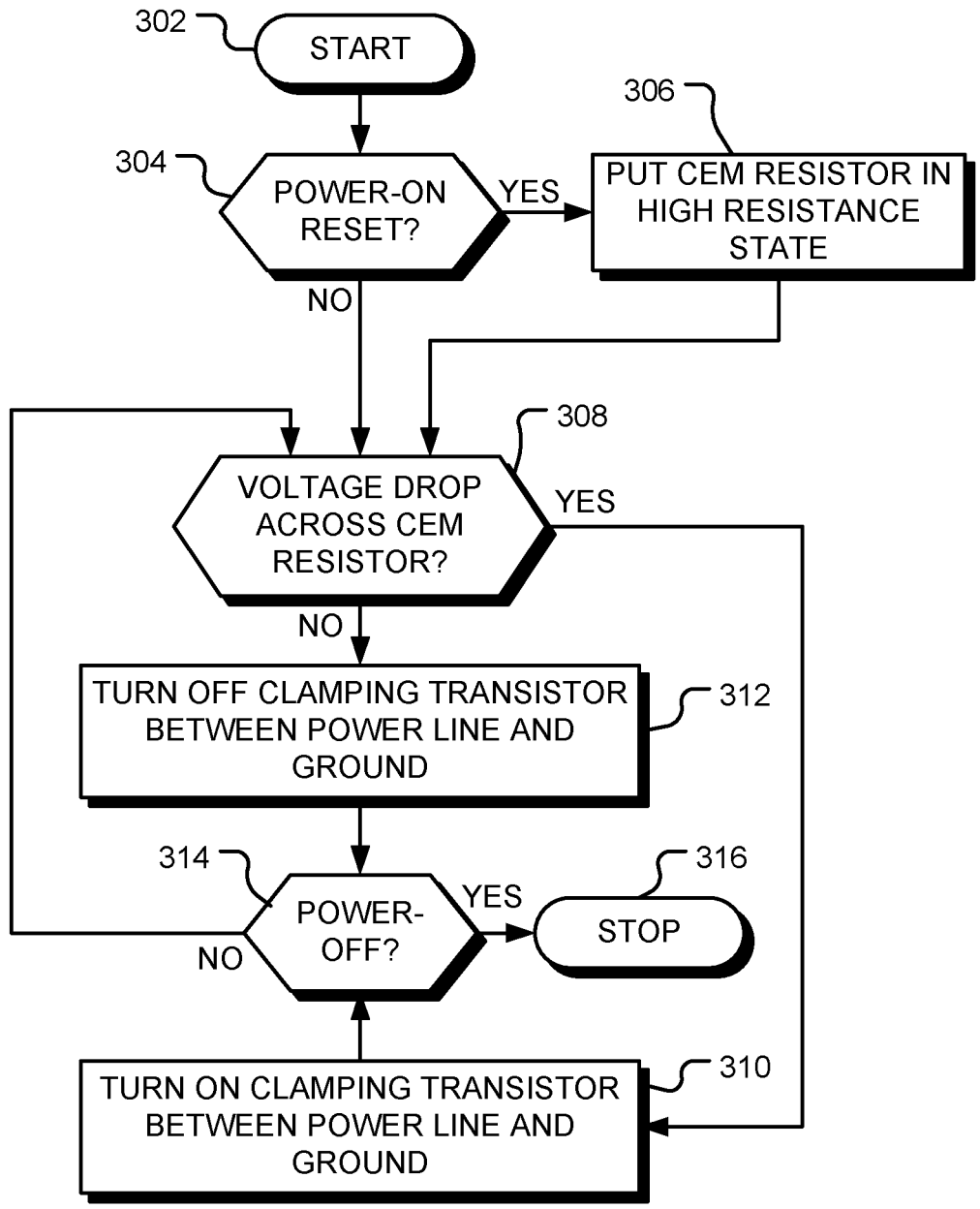
FIG. 3 is a flow chart of a method for protecting a circuit from a voltage spike on a power line of the circuit in accordance with embodiments of the disclosure.

FIG. 3 is a flow chart 300 of a method for protecting a circuit from a voltage spike on a power line of the circuit in accordance with embodiments of the disclosure. Following start block 302, if a power-on reset occurs, as depicted by the positive branch from decision block 304, a first Correlated Electron Material (CEM) device is put into a high impedance state at block 306. A first terminal of the first CEM device is coupled to the power line. At decision block 308, a voltage drop across the first CEM device is sensed or detected. If the voltage drop across the first CEM device exceeds a voltage threshold of the transistor, as depicted by the positive branch from decision block 308, a first transistor coupled between the power line and an electrical ground is turned ON at block 310, so that the power line is coupled to the electrical ground through the transistor. If the voltage drop across the first CEM device does not exceed the voltage threshold, as depicted by the negative branch from decision block 308, the first is turned OFF at block 312 so that the power line is no longer shorted to the electrical ground through the transistor. If the power is turned off, as depicted by the positive branch from decision block 314, the method is terminated at block 316, otherwise flow returns to decision block 308.

The voltage drop across the first CEM device may be detected using a comparator, for example. The output of the comparator may be coupled to the gate of the first transistor either directly or through one or more additional comparators. In one embodiment, the comparator comprises a first inverter and the output of the comparator is coupled to the gate of the first transistor via second and third inverters.

Figure 4:
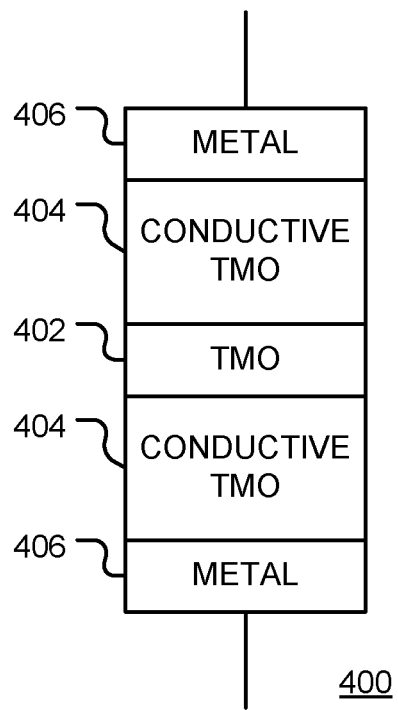
FIG. 4 is a block diagram of a correlated electron material (CEM) device, in accordance with embodiments of the disclosure.

FIG. 4 is a block diagram of correlated electron material (CEM) device 400 in accordance with embodiments of the disclosure. The CEM device 400 includes correlated electron material (CEM) 402. The CEM may be a transition metal oxide (TMO) material, such as NiO for example. The CEM is able to transition between two states—a high impedance state in which metal ions capture and localize all of the electrons in the material and a low impedance state in which electrons are not localized and the material behaves as a metal. In this embodiment, the CEM 402 is located between TMO conductors 404 and metal terminals 406.

State transitions in the CEM only occur when both voltage and current levels exceed certain thresholds. Once placed into a high impedance state, the CEM remains in a high impedance state, even when subject to a high voltage electrostatic discharge, for example, provided the current threshold is not exceeded in the CEM.

Figure 5:
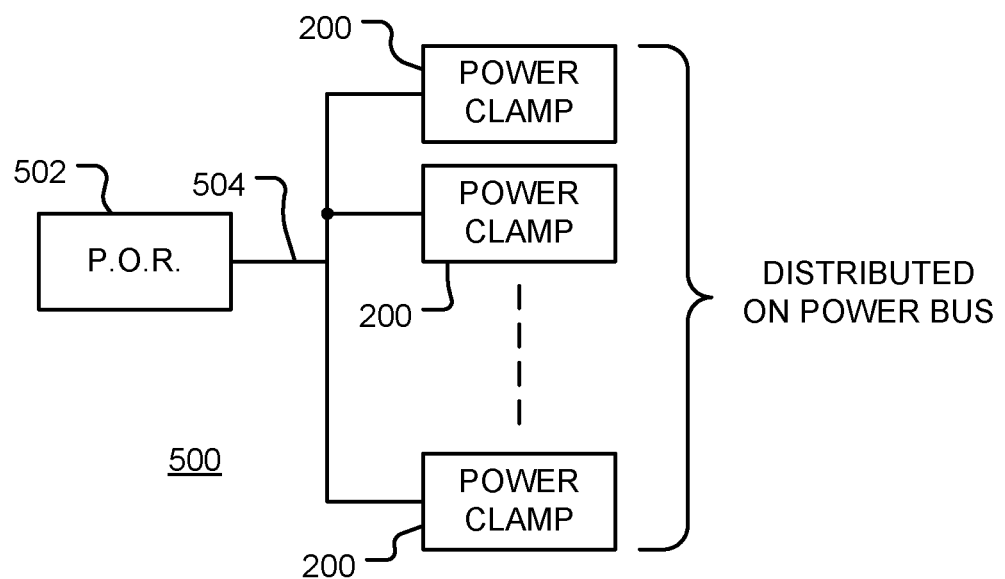
FIG. 5 is a block diagram of a system having a plurality of power clamps, in accordance with embodiments of the disclosure.

FIG. 5 is a block diagram of a system 500 having a plurality of power clamps 200, in accordance with embodiments of the disclosure. The power clamps 200 may be distributed at various locations on the power bus on an integrated circuit. A common power-on reset (POR) circuit 502 may be used to supply a reset signal on line 504 to multiple power clamps.

Figure 6:
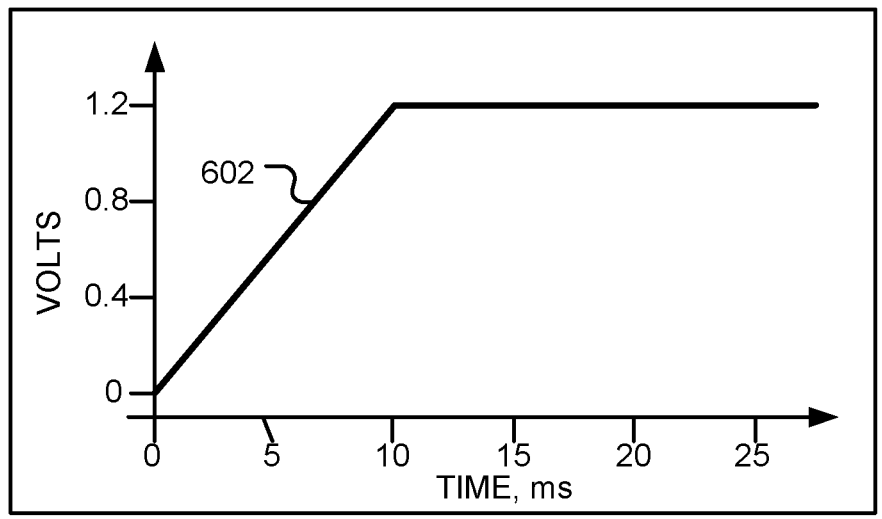
FIG. 6 is a graph of a supply voltage following a power on reset.

FIG. 6 is a graph of a supply voltage following a power on reset. In this example, following a power-on event at time zero, the supplied voltage ramps up to an operating level of 1.2V after 10 ms. Thereafter, the voltage remains at the operating level.

Figure 7:
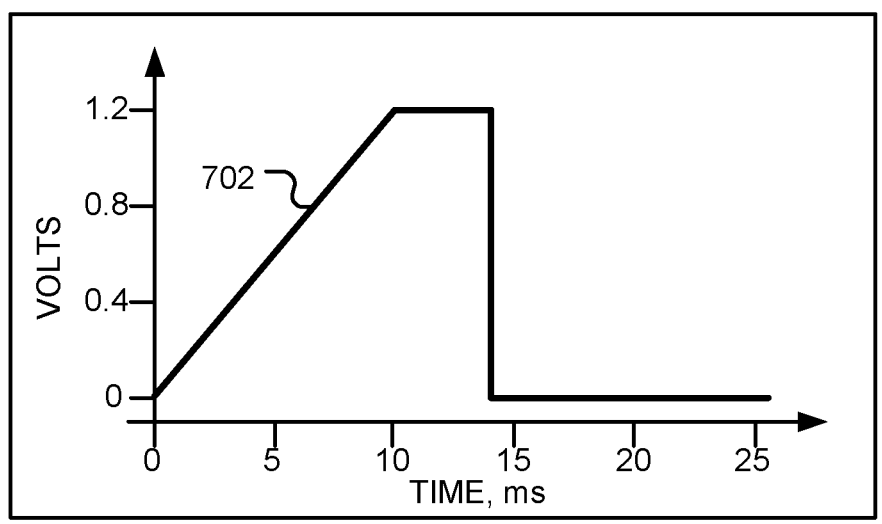
FIG. 7 is a graph of a reset signal voltage following a power on reset, in accordance with embodiments of the disclosure.

FIG. 7 is a graph of a reset signal voltage following a power on reset, in accordance with embodiments of the disclosure. In this example, the signal voltage following a power-on event at time zero, the reset signal ramps up, following the supply voltage, to a level of 1.2V after 10 ms. The reset signal remains at 1.2V for a short period to allow the CEM devices to be reset to the high impedance state, as discussed above. The reset signal then returns to zero.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So for example performing X includes any suitable method for causing another party such as a remote user, a remote processing resource (e.g., a server or cloud computer) or a machine to perform X. Similarly, performing elements X, Y, and Z may include any method of directing or controlling any combination of such other individuals or resources to perform element X, Y, and Z to obtain the benefit of such steps. Thus method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

Accordingly, some features of the disclosed embodiments are set out in the following numbered items:

1. A circuit for limiting an applied voltage applied between a power line and an electrical ground, the circuit comprising:
    a first transistive element coupled between the power line and the electrical ground to provide a channel, where current flow through the channel is controlled by a control voltage provided to a control terminal of the first transistive element;
    a first Correlated Electron Material (CEM) device coupled between the power line and a first node; and an inversion logic circuit coupled between the first node and the control terminal of the first transistive element, where a 'high' logic level of the inversion logic circuit is provided by the applied voltage.

2. The circuit of item 1, where during a time period in which a voltage at the first node corresponds to a 'low' logic level, the control voltage corresponds to a 'high' logic level that exceeds a threshold voltage of the first transistive element and the applied voltage is shunted to ground via the channel of the first transistive element and where the time period is dependent upon an impedance of the first CEM device.

3. The circuit of item 1, further comprising:
   a second CEM device and a second transistive element coupled in series between the electrical ground and the first node,
where the second transistive element is turned ON by application of a RESET signal applied to a control of the second transistive element, and
where, when the second transistive element is turned ON, the first and second CEM devices form voltage divider operable to transition the first and second CEM devices to a high impedance state.

4. The circuit of item 3, where at least one of the first and second transistive elements comprises a transistor and the control voltage is a gate voltage provided to a gate of the transistor.

5. The circuit of item 1, where the inversion logic circuit comprises:
   a first inversion stage, receiving an input from the first node and driving a second node as an output;
   a second inversion stage, receiving an input from the second node and driving a third node as an output; and
   a third inversion stage, receiving an input from the third node, and driving the control terminal of the first transistive element as an output.

6. The circuit of item 1, where the inversion logic circuit comprises three inverters coupled in a series arrangement.

7. The circuit of item 1, where the time period is dependent upon an impedance provided by the first CEM device and a stray capacitance of the circuit on the first node.

8. The circuit of item 1, where the CEM device comprises a transition metal oxide (TMO).

9. The circuit of item 1, where the CEM device comprises Nickel Oxide (NiO).

10. A circuit comprising:
    one or more power clamp circuits for limiting an applied voltage applied between a power line and an electrical ground, where a power clamp circuit of the one or more power clamp circuits comprises:
      a first transistive element coupled between the power line and the electrical ground to provide a channel, where current flow through the channel is controlled by a control voltage provided to a control terminal of the first transistive element;
      a first Correlated Electron Material (CEM) device coupled between the power line and a first node; and
      a sensing circuit coupled between the first node and the control of the first transistive element, where the sensing circuit is configured to detect a voltage drop across the CEM device and further configured to provide the control voltage,
    where the channel of the first transistive element is opened when the detected voltage drop across the CEM device exceeds a threshold.

11. The circuit of item 10, where the first CEM device comprises a transition metal oxide (TMO).

12. The circuit of item 10, where the first CEM device comprises Nickel Oxide (NiO).

13. The circuit of item 10, where the power clamp circuit of the one or more power clamp circuits further comprises:
    a second CEM device and a second transistive element coupled in series between the electrical ground and the first node,
where the second transistive element is turned ON by application of a RESET signal applied to a control of the second transistive element, and
where when the second transistive element is turned ON, the first and second CEM devices form voltage divider operable to transition the first and second CEM devices to a high impedance state.

14. The circuit of item 13, further comprising a power-on reset circuit operable to supply the RESET signal to a control terminal of the second transistive element.

15. The circuit of item 13, where at least one of the first and second transistive elements comprises a transistor and the control voltage is a gate voltage applied to a gate of the transistor.

16. A method for protecting a circuit from a voltage spike on a power line of the circuit, the method comprising:
    putting a first Correlated Electron Material (CEM) device in a high impedance state, where a first terminal of the first CEM device is coupled to the power line;
    detecting a voltage drop across the first CEM device; and
    turning ON a first transistive element coupled between the power line and an electrical ground while the voltage drop across the first CEM device exceeds a voltage threshold, such that the power line is coupled to the electrical ground.

17. The method of item 16, where detecting the voltage drop across the first CEM device comprises comparing a power line and a voltage at a second terminal of the CEM device in a comparator.

18. The method of item 17, where turning ON the first transistive element comprises coupling an output of the comparator to a control terminal of the first transistive element.

19. The method of item 18, where the comparator comprises a first inverter and wherein output of the comparator is coupled to the control terminal of the first transistive element via second and third inverters.

20. The method of item 16, where the CEM device includes a transition metal oxide (TMO) and wherein putting the first CEM device in the high impedance state comprises causing a Mott transition in the TMO.

What is claimed is:

1. A circuit for limiting an applied voltage applied between a power line and an electrical ground, the circuit comprising:
   a first transistive element coupled between the power line and the electrical ground to provide a channel, where current flow through the channel is controlled by a control voltage provided to a control terminal of the first transistive element;
   a first Correlated Electron Material (CEM) device coupled between the power line and a first node; and
   an inversion logic circuit coupled between the first node and the control terminal of the first transistive element,
   a 'high' logic level of the inversion logic circuit is provided by the applied voltage, and
   during a time period in which a voltage at the first node corresponds to a 'low' logic level, the control voltage corresponds to a 'high' logic level that exceeds a threshold voltage of the first transistive element and the applied voltage is shunted to ground via the channel of the first transistive element and where the time period is dependent upon an impedance of the first CEM device.

2. The circuit of claim 1, further comprising:
a second CEM device and a second transistive element coupled in series between the electrical ground and the first node,
where the second transistive element is turned ON by application of a RESET signal applied to a control of the second transistive element, and
where, when the second transistive element is turned ON, the first and second CEM devices form a voltage divider operable to transition the first and second CEM devices to a high impedance state.

3. The circuit of claim 2, where at least one of the first and second transistive elements comprises a transistor and the control voltage is a gate voltage provided to a gate of the transistor.

4. The circuit of claim 1, where the inversion logic circuit comprises:
a first inversion stage, receiving an input from the first node and driving a second node as an output;
a second inversion stage, receiving an input from the second node and driving a third node as an output; and
a third inversion stage, receiving an input from the third node, and driving the control terminal of the first transistive element as an output.

5. The circuit of claim 1, where the inversion logic circuit comprises three inverters coupled in a series arrangement.

6. The circuit of claim 1, where the time period is dependent upon the impedance of the first CEM device and a stray capacitance of the inversion logic circuit on the first node.

7. The circuit of claim 1, where the CEM device comprises a transition metal oxide (TMO).

8. The circuit of claim 1, where the CEM device comprises Nickel Oxide (NiO).

9. A circuit comprising:
one or more power clamp circuits for limiting an applied voltage applied between a power line and an electrical ground, where a power clamp circuit of the one or more power clamp circuits comprises:
a first transistive element coupled between the power line and the electrical ground to provide a channel, where current flow through the channel is controlled by a control voltage provided to a control terminal of the first transistive element;
a first Correlated Electron Material (CEM) device coupled between the power line and a first node; and
a second CEM device and a second transistive element coupled in series between the electrical ground and the first node; and
a sensing circuit coupled between the first node and the control of the first transistive element, where the sensing circuit is configured to detect a voltage drop across the CEM device and further configured to provide the control voltage,
the channel of the first transistive element is opened when the detected voltage drop across the CEM device exceeds a threshold,
the second transistive element is turned ON by application of a RESET signal applied to a control of the second transistive element, and
when the second transistive element is turned ON, the first and second CEM devices form a voltage divider operable to transition the first and second CEM devices to a high impedance state.

10. The circuit of claim 9, where the first CEM device comprises a transition metal oxide (TMO).

11. The circuit of claim 9, where the first CEM device comprises Nickel Oxide (NiO).

12. The circuit of claim 9, further comprising a power-on reset circuit operable to supply the RESET signal to a control terminal of the second transistive element.

13. The circuit of claim 9, where at least one of the first and second transistive elements comprises a transistor and the control voltage is a gate voltage applied to a gate of the transistor.

14. A method for protecting a circuit from a voltage spike on a power line of the circuit, the method comprising:
putting a first Correlated Electron Material (CEM) device and a second CEM device in a high impedance state during application of a RESET signal, where a first terminal of the first CEM device is coupled to the power line and where a first terminal of the second CEM device is coupled to an electrical ground;
detecting a voltage drop across the first CEM device; and
turning ON a first transistive element coupled between the power line and an electrical ground while the voltage drop across the first CEM device exceeds a voltage threshold, such that the power line is coupled to the electrical ground.

15. The method of claim 14, where detecting the voltage drop across the first CEM device comprises comparing a voltage of the power line and a voltage at a second terminal of the first CEM device in a comparator.

16. The method of claim 15, where turning ON the first transistive element comprises coupling an output of the comparator to a control terminal of the first transistive element.

17. The method of claim 16, where the comparator comprises a first inverter and wherein output of the comparator is coupled to the control terminal of the first transistive element via second and third inverters.

18. The method of claim 14, where the first CEM device includes a transition metal oxide (TMO) and wherein putting the first CEM device in the high impedance state comprises causing a Mott transition in the TMO.

\* \* \* \* \*